United States Patent
Yoon et al.

[11] Patent Number: 6,141,271
[45] Date of Patent: Oct. 31, 2000

[54] CIRCUITS FOR TESTING MEMORY DEVICES HAVING DIRECT ACCESS TEST MODE AND METHODS FOR TESTING THE SAME

[75] Inventors: Sun-byeong Yoon; Kye-hyun Kyung, both of Kyungki-do, Rep. of Korea

[73] Assignee: Samsung Electronics Co., Ltd., Rep. of Korea

[21] Appl. No.: 09/198,704

[22] Filed: Nov. 24, 1998

[30] Foreign Application Priority Data

Dec. 3, 1997 [KR] Rep. of Korea ............. 97-65540

[51] Int. Cl.[7] .................................... G11C 7/00
[52] U.S. Cl. ................................ 365/201; 365/193
[58] Field of Search ................... 365/201, 189.01, 365/189.02, 189.05, 193

[56] References Cited

U.S. PATENT DOCUMENTS

| | | | |
|---|---|---|---|
| 5,204,837 | 4/1993 | Suwa et al. | 365/201 |
| 5,228,000 | 7/1993 | Yamagata | 365/201 |
| 5,293,341 | 3/1994 | Tsujimoto | 365/201 |
| 5,416,741 | 5/1995 | Ohsawa | 365/201 |
| 5,469,445 | 11/1995 | Nicolaidis | 371/22.3 |
| 5,506,499 | 4/1996 | Puar | 324/158.1 |
| 5,557,574 | 9/1996 | Senoo et al. | 365/201 |
| 5,574,692 | 11/1996 | Dierke | 365/201 |
| 5,642,057 | 6/1997 | Oke et al. | 324/762 |
| 5,668,815 | 9/1997 | Gittinger et al. | 371/21.2 |
| 5,708,614 | 1/1998 | Koshikawa | 365/201 |
| 5,793,685 | 8/1998 | Suma | 365/201 |
| 5,877,987 | 3/1999 | Merritt | 365/189.05 |

FOREIGN PATENT DOCUMENTS

| | | |
|---|---|---|
| 03253000A | 11/1991 | Japan. |
| 08273352 B1 | 10/1996 | Japan. |
| 09213072 | 8/1997 | Japan. |

OTHER PUBLICATIONS

European Search Report, EP 98 30 3712, Sep. 28, 1998.

*Primary Examiner*—Richard Elms
*Assistant Examiner*—Anh Phung
*Attorney, Agent, or Firm*—Myers Bigel Sibley & Sajovec

[57] ABSTRACT

An integrated circuit memory device includes a test mode. Data is written to and read from the integrated circuit memory device in the test mode. The integrated circuit memory device includes a memory array that includes memory cells that store data. A test control circuit generates control signals that control the data read from the memory cells. A data output circuit outputs data read from the memory cells from the integrated circuit memory device in response to the test column address strobe signal. In particular, the test column address strobe signal includes a series of high to low and low to high transitions, wherein the data output circuit outputs data read from the memory cells in response to the series of high to low and low to high transitions. The high to low and low to high transitions of the test column address strobe signal may be used to output the data read from the memory cells, thereby reducing the need for an external test clock signal to be supplied to the integrated circuit memory device during testing.

21 Claims, 6 Drawing Sheets

CIRCUITS FOR TESTING MEMORY DEVICES HAVING DIRECT ACCESS TEST MODE AND METHODS FOR TESTING THE SAME

CROSS-REFERENCE TO RELATED APPLICATIONS

This application is related to application Ser. No. 09/198, 702, entitled "INTEGRATED CIRCUIT MEMORY DEVICES HAVING DIRECT ACCESS MODE TEST CAPABILITY AND METHODS OF TESTING SAME" (Attorney Docket No. 5649-561, filed concurrently herewith, the disclosures of which are hereby incorporated herein by reference.

FIELD OF THE INVENTION

The present invention relates to integrated circuit (IC) memory devices, and more particularly to test circuits and methods for integrated circuit memory devices.

BACKGROUND OF THE INVENTION

Integrated circuit memory devices are widely used in consumer and commercial electronics. Integrated circuit memory devices may also be integrated with logic circuits, microprocessors and/or other devices.

Figure 1:
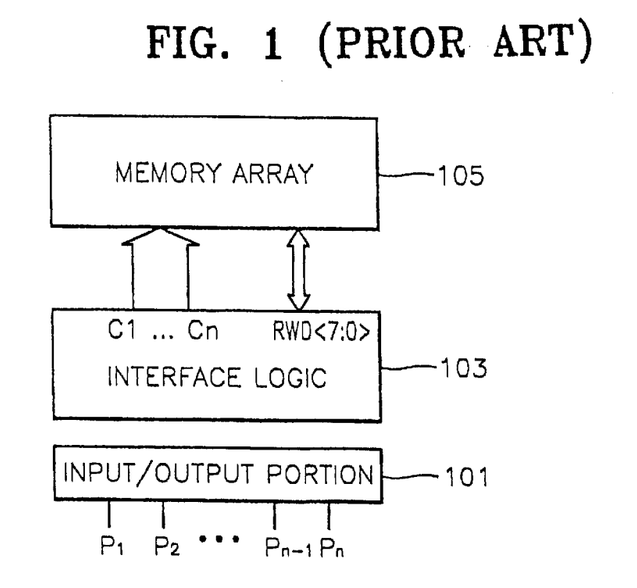
FIG. 1 is a block diagram of a conventional integrated circuit memory device.

In general, high speed integrated circuit memory devices include a memory array 105, an input/output portion 101 and interface logic 103 as shown in FIG. 1. The input/output portion 101 receives commands or data via the external pins P1 through Pn and outputs internal data via the external pins P1 through Pn. The interface logic 103 receives commands from the input/output portion 101 and decodes the received commands to generate control signals C1 through Cn that control the memory array 105, and transmits the data via the input/output portion 101 to data lines RWD<7:0> of the memory array 105.

A direct access test mode is used to test memory cells in the memory array 105. The direct access test mode bypasses the interface logic 103 using a test apparatus and directly connects the external pins P1 through Pn to the control signals C1 through Cn of the memory array 105, to test the memory cells of the memory array 105. In the direct access test mode, data is written to memory cells, and then read back from the same memory cells. The data written to the memory cells is compared to the data read back, to thereby determine the condition (pass or fail) of the memory cells.

Figure 2:
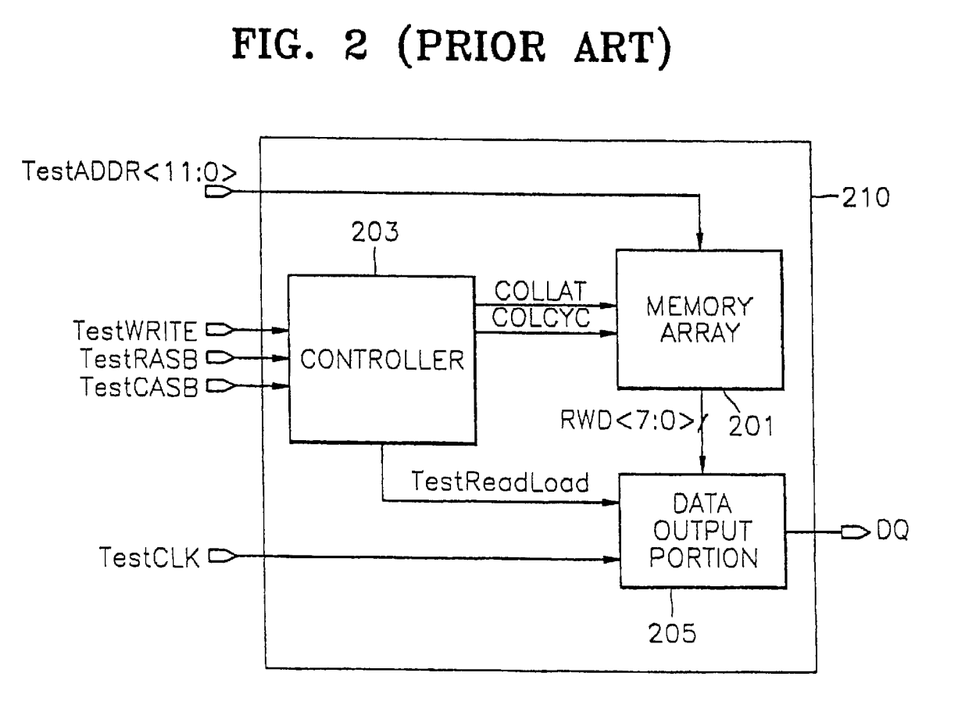
FIG. 2 is a block diagram of an integrated circuit memory device having a conventional direct access test mode.

FIG. 2 is a block diagram of a high speed integrated circuit memory device 210 having a conventional direct access test mode. The integrated circuit memory device 210 includes a memory array 201, a controller 203 and a data output portion 205. Data is read back from the memory array 201 using external signals TestWRITE, TestRASB, TestCASB and the TestCLK in the direct access test mode.

Figure 3:
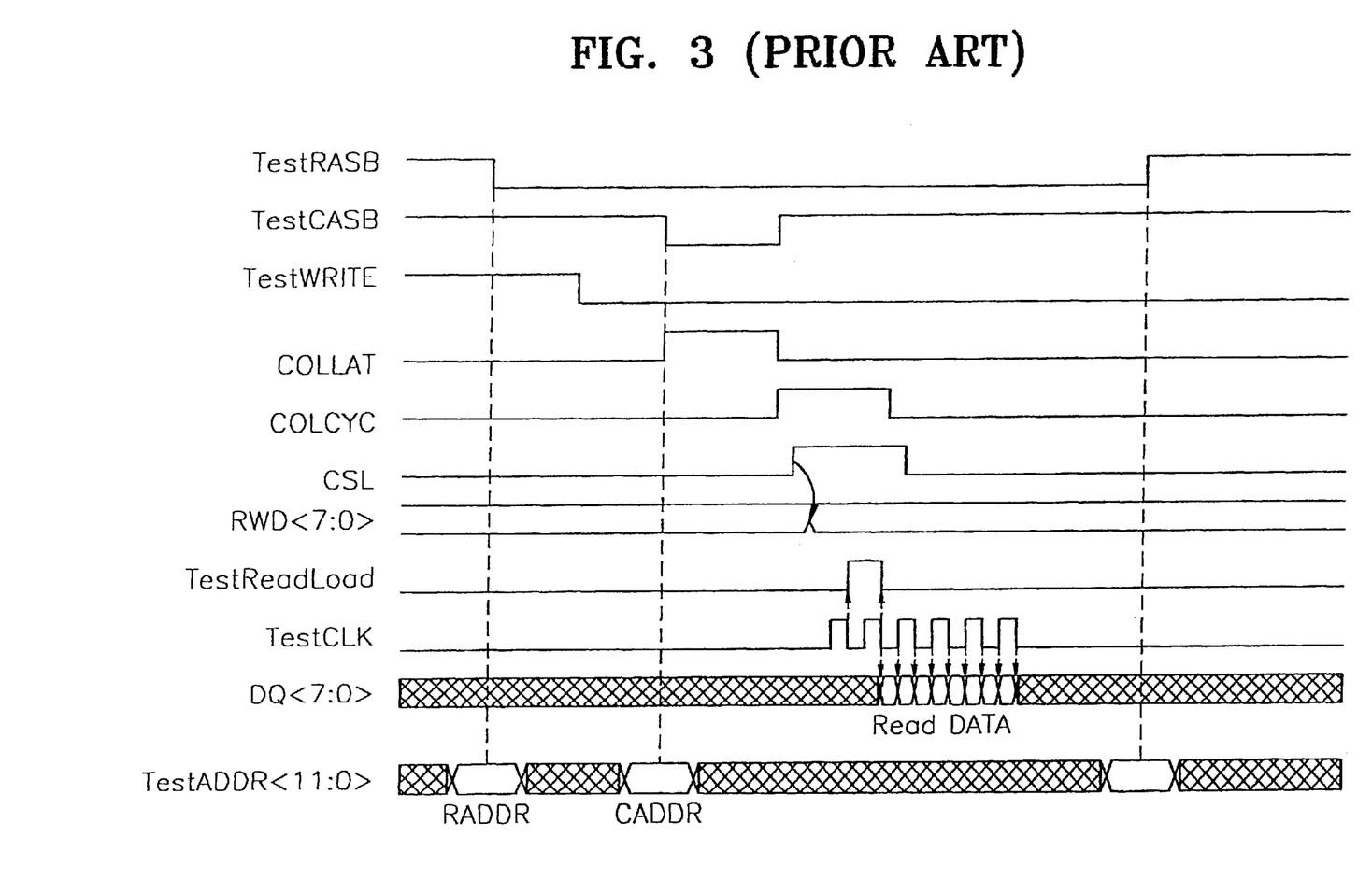
FIG. 3 is a timing diagram of a conventional test read cycle of an integrated circuit memory device of FIG. 2.

FIG. 3 is a timing diagram of the data being read back from the high speed semiconductor memory device 210 of FIG. 2 in direct access test mode. When a row address strobe signal (TestRASB) transitions to "low" state, a corresponding word line (not shown) in the memory array 201 enables a test row address (RADDR) applied to address pins TestADDR<11:0>. When a TestCASB transitions to a "low" state, a column select line (CSL) in the memory array 201, transitions to a "high" state, corresponding to a test address (TestADDR<11:0>). When the TestWRITE signal transitions to a "low" state, a read operation begins. Accordingly, data read from the memory array 201 is transmitted to the data lines (RWD<7:0>).

The data transmitted to the data lines RWD<7:0> is stored in the data output portion 205 in response to the control signal TestReadLoad generated between first and second falling edges of the clock signal (TestCLK) applied to a clock pin. The data stored in the data output portion 205 is then output serially via an input/output pin (DQ) in response to the clock signal.

As described above, in conventional integrated circuit memory devices having a direct access test mode, an additional pin may be used to apply the clock signal to output data. As more pins are used for the direct access test mode, fewer IC memory devices can be tested simultaneously, thereby increasing the test time. Accordingly, there is a need to reduce the number of pins that need to be used in testing integrated circuit memory devices.

SUMMARY OF THE INVENTION

It is, therefore, an object of the present invention to provide improved circuits and methods for testing integrated circuit memory devices.

It is another object of the invention to allow an increase in the number of integrated circuit memory devices that may be tested simultaneously.

To achieve these and other objects, advantages, and features of the present invention, integrated circuits and methods are provided in which data is read from memory cells and is output from the memory integrated circuit in response to a test column address strobe signal. Accordingly, the integrated circuit memory device may be free of a test clock pin. In particular, a memory array includes memory cells that store data. A test control circuit generates control signals that control the data read from the memory cells in response to a test column address strobe signal. A data output circuit outputs data read from the memory cells from the integrated circuit memory device in response to the test column address strobe signal.

In one aspect of the invention, the test column address strobe signal includes a series of high to low and low to high transitions, wherein the data output circuit outputs data read from the memory cells in response to the series of high to low and low to high transitions. The high to low and low to high transitions of the test column address strobe signal may be used to output the data read from the memory cells, thereby reducing the need for an external test clock signal to be supplied to the integrated circuit memory device. Consequently, the present invention may allow a reduction in the number of signals needed to test integrated circuit memory devices, and therefore allow an increase in the number of integrated circuit memory devices that may be tested simultaneously. In contrast, according to the prior art, an external test clock signal may be supplied to the integrated circuit memory device, wherein the external test clock signal may be used to output the data read from the memory cells.

The data output circuit includes a data latch that latches the data read from the memory cells in response to a control signal. A shift register shifts the latched data in response to the test column address strobe signal. In one aspect, the latched data includes odd data bits and even data bits, wherein the odd data bits are output from the integrated circuit memory device in response to high to low transitions of the test column address strobe signal and the even data bits are output from the integrated circuit memory device in response to low to high transitions of the test column address strobe signal. Accordingly, the number of integrated circuit memory devices that may be tested simultaneously may be increased.

According to method aspects of the present invention, an integrated circuit memory device, that includes a test mode, is tested by reading data from memory cells and outputting the data from the integrated circuit memory in response to a test column address strobe signal. Thus, data may be output from the integrated circuit memory device without an external clock signal. In particular, data is written to and read from the integrated circuit memory device in the test mode. A plurality of control signals are generated that read data from a plurality of memory cells in a memory array in the integrated circuit memory device. The data read from the plurality of memory cells is output from the integrated circuit memory device in response to a test column address strobe signal.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 4:
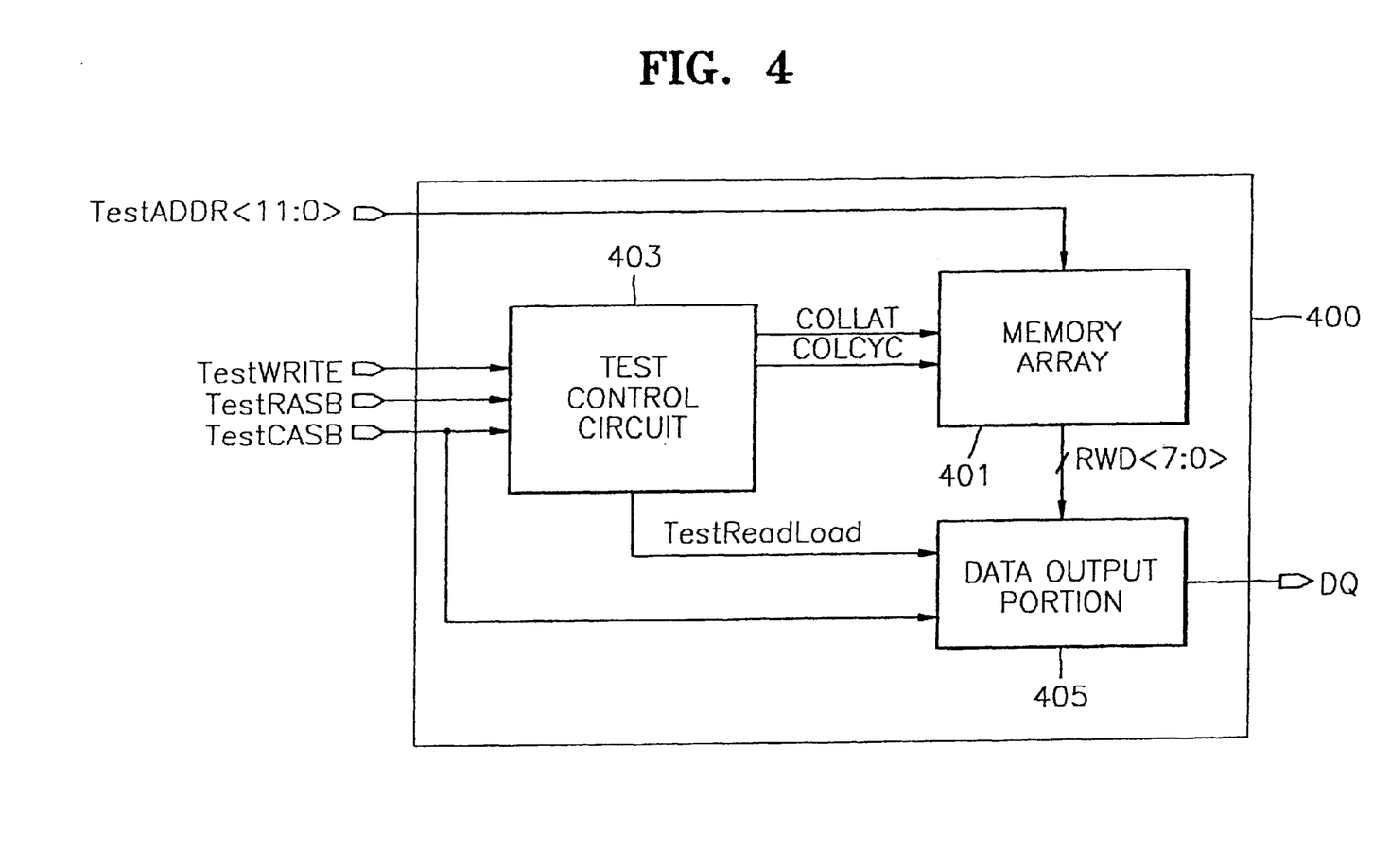
FIG. 4 is a block diagram of an integrated circuit memory device having a direct access test mode according to the present invention.

FIG. 4 is a block diagram of an integrated circuit memory device 400 having a direct access test mode according to the present invention. The integrated circuit memory device 400 includes a memory array 401, a test control circuit 403 and a data output circuit 405.

The test control circuit 403 generates control signals COLLAT, COLCYC and TestReadLoad in response to a test row address strobe signal (TestRASB), a test column address strobe signal (TestCASB), and a test write control signal (TestWRITE) applied to corresponding external pins. The memory array 401 includes a plurality of memory cells that store data. The stored data is output to data lines RWD<7:0> in response to the first and second control signals COLLAT and COLCYC and to a test address TestADDR<11:0> applied to address pins. The data output circuit 405 latches data on the data lines RWD<7:0> in response to TestReadLoad. The data output circuit 405 outputs the latched data via the input/output pin DQ in response to TestCASB. The test column address strobe signal includes a series of transitions from a high state to a low state and a low state to a high state.

The control circuit 403 reads data from the memory array 401. The data output circuit 405 outputs the data read from the memory array 401 in response to a series of transitions of the column address strobe signal TestCASB. Accordingly, an external clock signal for controlling the data output circuit 405 may not be required, thereby the integrated circuit memory device may be free of a test clock pin, allowing a reduction in the number of signals generated by a tester and consequently, allowing an increase in the number of memory devices that may be simultaneously tested.

Figure 5:
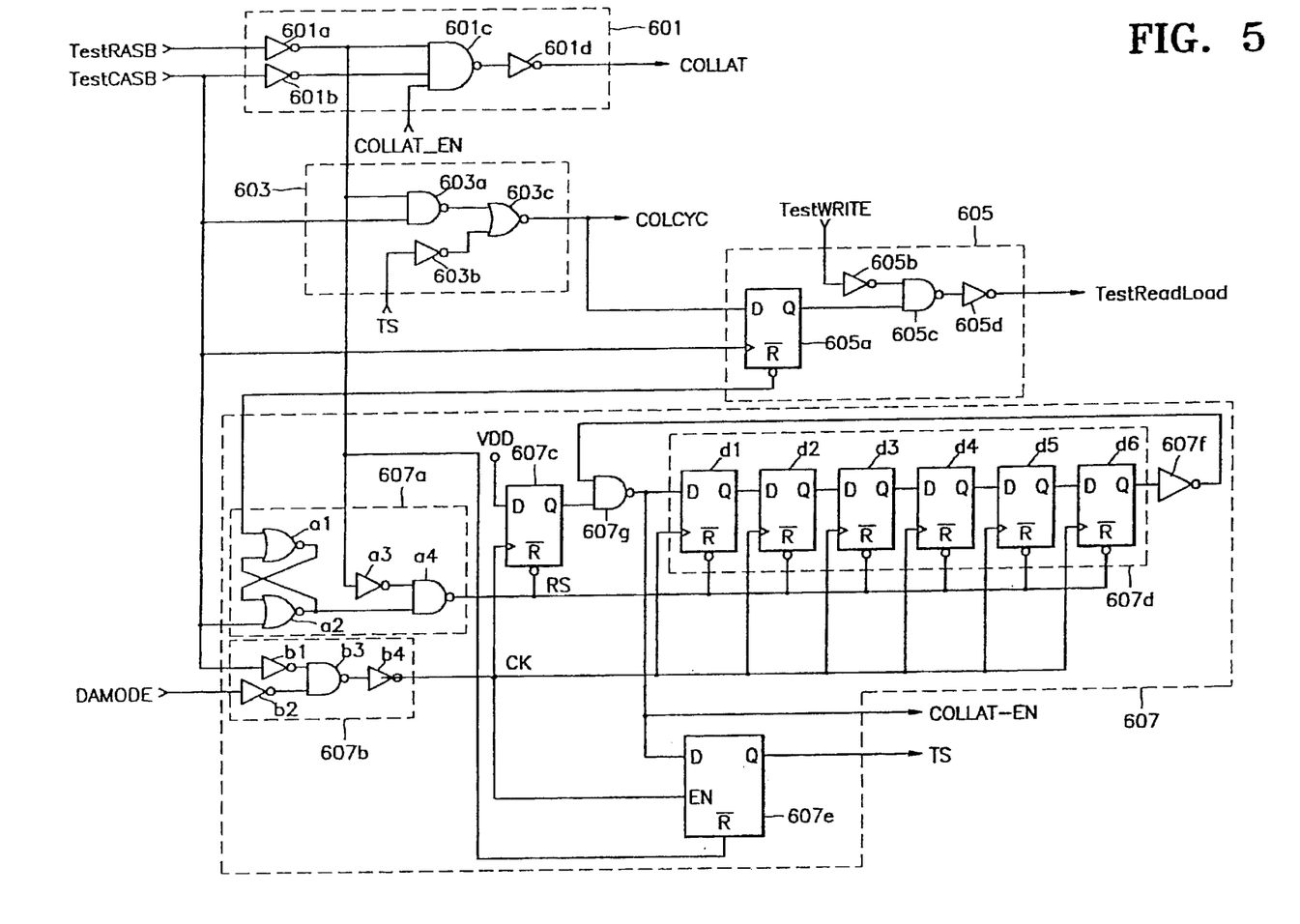
FIG. 5 is an embodiment of a test control circuit shown in FIG. 4.

Referring to FIG. 5, an embodiment of a test control circuit 403 includes a first control signal generator 601, a second control signal generator 603, a third control signal generator 605 and an enable signal generator 607.

The first control signal generator 601 generates a first control signal (COLLAT) in response to a first count of transitions of the test column address strobe signal that latches the test address TestADDR<11:0> received by the memory array 401. For example, the first count of transitions of the test column address strobe signal can be the first high to low transition of the test column address strobe signal in the current read operation.

The second control signal generator 603 generates a second control signal (COLCYC) in response to a second count of transitions of the test column address strobe signal, to enable a column select line CSL (not shown) in the memory array 401. For example, the second count of transitions of the test column address strobe signal can be the first low to high transition of the test column address strobe signal in the read operation.

The third control signal generator 605 generates a third control signal (TestReadLoad) in response to a third count of transitions of the test column address strobe signal, to latch data transmitted from the plurality of memory cells on the data lines RWD<7:0> in the data output circuit 405. For example, the third count of transitions of the test column address strobe signal can be the second high to low transition of the test column address strobe signal in the read operation.

The enable signal generator 607 generates a first and a second enable signal (COLLAT-EN and TS) to enable the first and second control signal generators 601 and 603.

The first control signal generator 601 includes a first inverter 601a that inverts the test row address strobe signal, the second inverter 601b that inverts the test column address strobe signal, a NAND gate 601c that logically NANDs the outputs of the first and second inverters 601a and 601b and the first enable signal COLLAT-EN, and a third inverter 601d that inverts the output of the NAND gate 601c so as to generate the first control signal COLLAT.

The second control signal generator 603 includes a NAND gate 603a that logically NANDs an inversion of the test row address strobe signal and the test column address strobe signal. An inverter 603b inverts the second enable signal TS. A NOR gate 603c logically NORs the output of the NAND gate 603a and the output of the inverter 603b so as to generate the second control signal COLCYC.

The third control signal generator 605 includes a flip-flop 605a reset by an inversion of the test row address strobe signal.. The flip-flop 605a delays the second control signal COLCYC in response to the test column address strobe signal. An inverter 605b inverts the test write control signal. A NAND gate 605c logically NANDs the output of the inverter 605b and the output of the flip-flop 605a. An inverter 605d inverts the output of the NAND gate 605c to generate the third control signal TestReadLoad.

The enable signal generator 607 includes a reset signal generator 607a, a clock signal generator 607b, a flip-flop 607c, a 6-bit shift register 607d, a latch 607e, an inverter 607f and a NAND gate 607g. The reset signal generator 607a generates a reset signal (RS) based on an inversion of the test row address strobe signal and the test column address strobe signal.

The clock signal generator 607b generates a clock signal (CK) based on the column address strobe signal and a direct access test mode signal (DAMODE) applied via an external pin of the integrated circuit memory device. The flip-flop 607c is reset by the reset signal and clocks a start signal in response to the clock signal. The start signal is clocked into the shift register 607d. Subsequently, the start signal ripples through stages of the shift register 607d in response to further transitions of the clock signal. When the start signal reaches the last stage of the shift register 607d, the start signal is provided to the inverter 607f. The inverter 607f inverts the start signal so as to provide an end signal. The NAND gate 607e produces a logical NAND of the end signal and the start signal. The initial occurrence of the start signal begins the generation of the enable signals and the end signal terminates the enable signals.

The 6-bit shift register 607d is reset by the reset signal and shifts in the start signal in response to the clock signal. The latch 607e is reset by the inversion of the test row address strobe signal and enabled by the clock signal. The latch latches the first enable signal in response to the clock signal, so as to provide the second enable signal (TS).

The reset signal generator 607a includes a NOR gate a1 that logically NORs the test row address strobe signal and the output of the NOR gate a2. The NOR gate a2 logically NORs the test column address strobe signal and the output of the NOR gate a1. An inverter a3 inverts the test row address strobe signal and the NAND gate a4 logically NANDs the output of the inverter a3 and the output of the NOR gate a2 so as to provide the reset signal RS.

The clock signal generator 607b includes an inverter b1 that inverts the test column address strobe signal. An inverter b2 inverts the direct access test mode signal. A NAND gate b3 logically NANDs the output signals of the inverters b1 and b2. An inverter b4 inverts the output of the NAND gate b3, so as to provide the clock signal CK.

Figure 6:
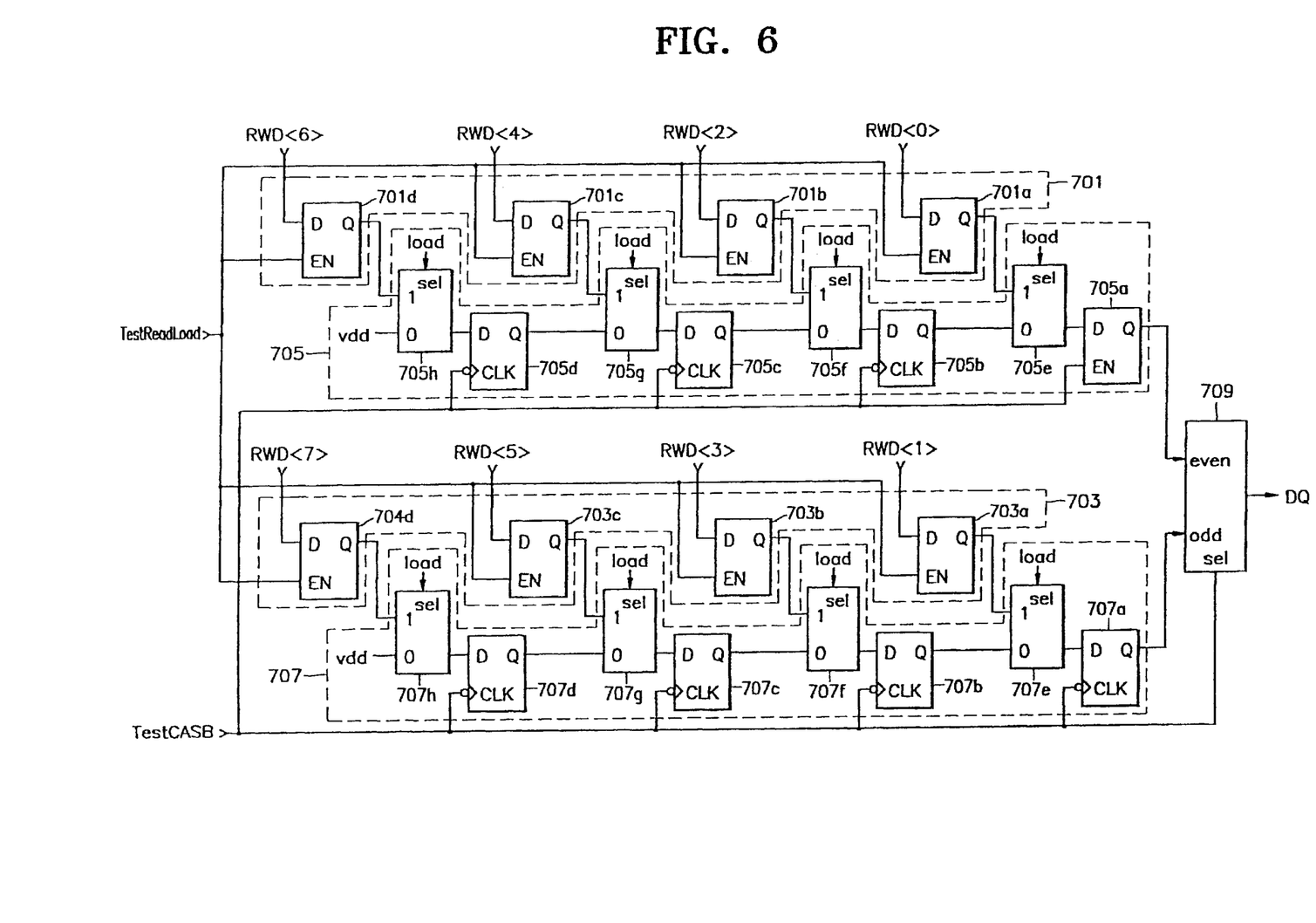
FIG. 6 is a circuit diagram of a data output circuit shown in FIG. 4.

Referring to FIG. 6, the data output circuit includes a first latch 701, a second latch 703, a first shift register 705, a second shift register 707 and a multiplexer 709. The first latch 701 latches the odd data bits RWD<0, 2, 4, 6> of data transmitted from the plurality of memory cells via the data lines RWD<7:0> in response to the third control signal TestReadLoad. The second latch 703 latches the even data bits RWD<1, 3, 5, 7> of data transmitted from the plurality of memory cells via the data lines RWD<7:0> in response to the third control signal.

The first shift register 705 receives the latched odd data bits from the first latch 701 in response to a load signal and sequentially shifts the odd data bits on the transition of the column address strobe signal. The second shift register 707 receives the latched even data bits from the second latch 703 in response to the load signal and sequentially shifts the even data bits on the transition of the column address strobe signal. The multiplexer 709 serially outputs data from the first shift register 705 (odd data bits) via the input/output pin DQ on the high to low transitions of the column address strobe signal and serially outputs data from the second shift register 707 (even data bits) on the low to high transitions of the test column address strobe signal.

Figure 7:
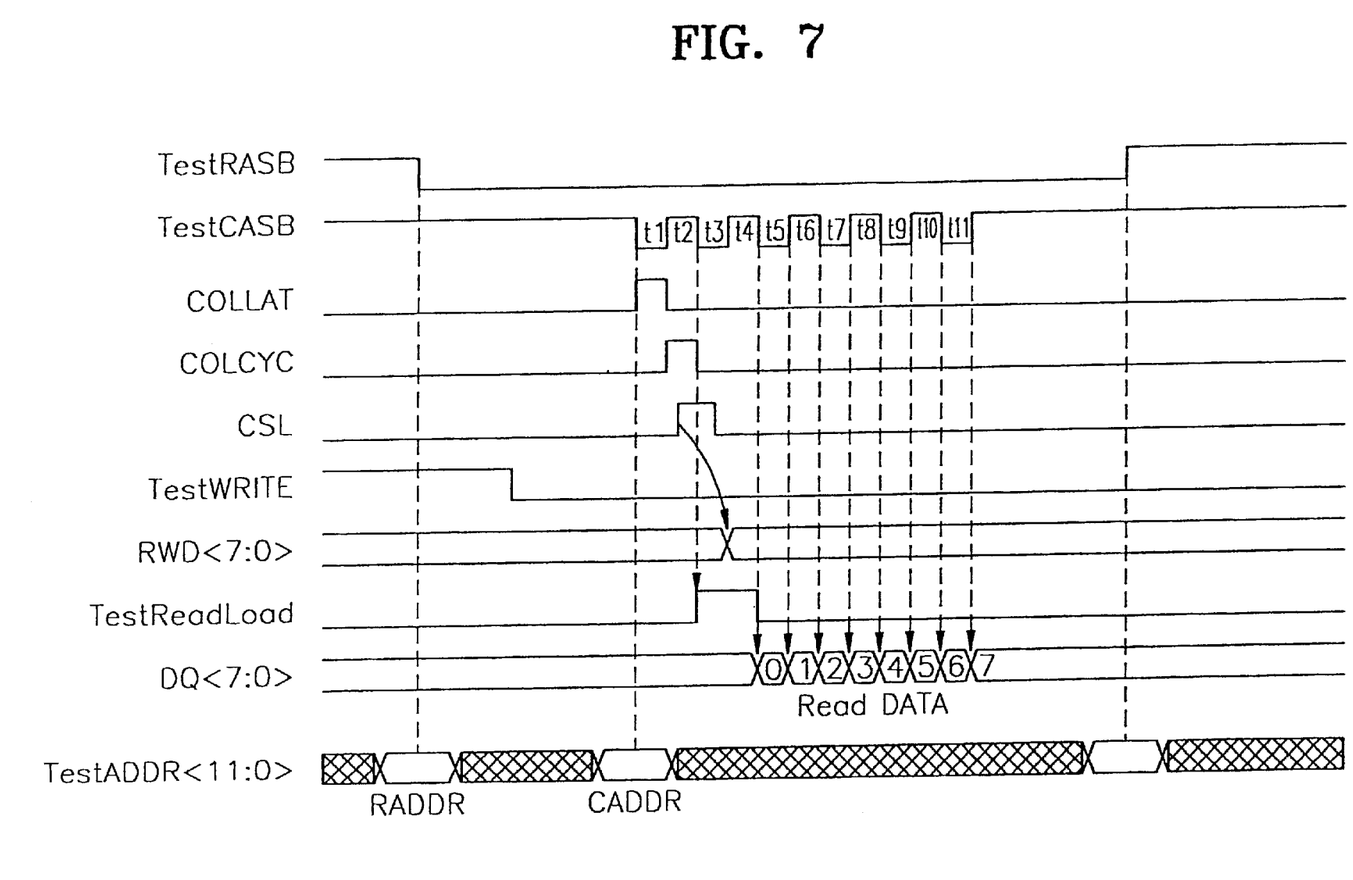
FIG. 7 is a timing diagram of a test read cycle of an integrated circuit memory device of FIG. 4.

FIG. 7 is a timing diagram of a test read operation in an integrated circuit memory device according to the present invention. When a test row address strobe signal (TestRASB) transitions to a "low" state, a corresponding word line (not shown) of the memory array 401 is enabled by a test address that is applied to address pins (TestADDR<11:0>). A first control signal, COLLAT, transitions to a high state on the first transition of the column address strobe signal TestCASB, i.e. a first "low" interval t1. Accordingly, a test address TestADDR<11:0> received by the memory array 401 is latched. A second control signal, COLCYC, transitions to a "high" state on the second transition of the column address strobe signal (TestCASB), i.e., a second "high" interval t2. The column select line CSL in the memory array 401 transitions to a "high" state in response to the first and second control signals. Accordingly, the data read from the memory array 401 is transmitted on the data lines RWDV<7:0>. The column select line is selected by the column address CADDR. A third control signal transitions to a "high" state on the third transition of the column address strobe signal, i.e., intervals t3 and t4. The data transmitted on the data lines RWD<7:0> is then latched in the data output circuit 405.

The latched data is sequentially output in synchronization with the fourth and subsequent transitions of the column address strobe signal (ie., from the falling edge of an interval t4) from the least significant bit (LSB), via the input/output pin DQ. In detail, the data latched in the data output circuit 405 is serially output via the input/output pin DQ on the high to low and low to high transitions of the test column address strobe signal after the interval t4. Odd data 0, 2, 4 and 6 of the latched data are output via the input/output pin DQ on the high to low transitions of the test column address strobe signal after the interval t4, and the even data bits 1, 3, 5 and 7 are output via the input/output pin DQ on the low to high transition of the test column address strobe signal after the interval t4.

According to integrated circuit memory devices of the present invention, data can be read from a memory array using the test column address strobe signal to output the data in a direct test access mode. Thus, the number of pins that the integrated circuit memory device used to perform testing may be reduced, thereby allowing an increase in the number of IC memory devices that may be tested simultaneously.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device that includes a test mode, wherein data is written to and read from the integrated circuit memory device in the test mode, the integrated circuit memory device comprising:

a memory array that includes a plurality of memory cells that store data;

a test control circuit, responsive to a test column address strobe signal, that generates a plurality of control signals that control the data read from the plurality of memory cells; and a data output circuit, responsive to the plurality of memory cells, that outputs data read from the plurality of memory cells to external of the integrated circuit memory device in response to a series of high to low and low to high transitions of the test column address strobe signal during at least one of a high and low state of a test row address strobe signal.

2. The integrated circuit memory device of claim 1, wherein the test column address strobe signal includes a series of high to low and low to high transitions, and wherein the data output circuit outputs data read from the plurality of memory cells in response to the series of high to low and low to high transitions.

3. The integrated circuit memory device of claim 1, wherein the test control circuit comprises an enable signal generator, responsive to the test column address strobe signal, that generates a first enable signal, and a second enable signal in response to a count of transitions of the test column address strobe signal.

4. The integrated circuit memory device of claim 3, wherein the test control circuit comprises:
    a first control signal generator, responsive to the first enable signal and the test column address strobe signal, that generates a first control signal in response to a first count of transitions of the test column address strobe signal so as to latch a test address to the plurality of memory cells;
    a second control signal generator, responsive to the second enable signal and the test column address strobe signal, that generates a second control signal in response to a second count of transitions of the test column address strobe signal so as enable a column select line to the plurality of memory cells; and
    a third control signal generator, responsive to the second control signal and the test column address strobe signal, that generates a third control signal that latches the data read from the plurality of memory cells in the data output circuit.

5. The integrated circuit memory device of claim 1, wherein the data output circuit comprises:
    a data latch, responsive to the plurality of memory cells, that latches the data read from the plurality of memory cells in response to a control signal; and
    a shift register, responsive to the data latch, that shifts the data latched by the data latch in response to the test column address strobe signal.

6. The integrated circuit memory device of claim 5, wherein the latched data includes a plurality of odd data bits and even data bits, and wherein the odd data bits are output from the integrated circuit memory device in response to high to low transitions of the test column address strobe signal, and wherein the even data bits are output from the integrated circuit memory device in response to low to high transitions of the test column address strobe signal.

7. The integrated circuit memory device of claim 1, wherein the data read from the plurality of memory cells includes odd data bits and even data bits, wherein the data output circuit comprises:
    a first latch, responsive to the plurality of memory cells, that latches the odd data bits in the data read from the plurality of memory cells so as to produce latched odd data bits;
    a second latch, responsive to the plurality of memory cells, that latches the even data bits in the data read from the plurality of memory cells so as to produce latched even data bits;
    a first shift register, responsive to the first latch, that stores the latched odd data bits in response to a control signal and shifts the stored latched odd data bits in response to high to low transitions of the test column address strobe signal;
    a second shift register, responsive to the second latch, that stores the latched even data bits in response to the control signal and shifts the stored latched even data bits in response to high to low transitions of the test column address strobe signal; and
    a multiplexer, responsive to the first and second shift registers, that outputs the odd data bits shifted from the first latch from the integrated circuit memory device in response to a first transition of the test column address strobe signal and that outputs the even data bits shifted from the second latch from the integrated circuit memory device in response to a second transition of the test column address strobe signal.

8. A method of testing an integrated circuit memory device that includes a test mode, wherein data is written to and read from the integrated circuit memory device in the test mode, the method comprising:
    generating a plurality of control signals that read data from a plurality of memory cells in a memory array in the integrated circuit memory device; and
    outputting the data read from the plurality of memory cells to external of the integrated circuit memory device in response to a series of high to low and low to high transitions of a test column address strobe signal during at least one of a high and low state of a test row address strobe signal.

9. The method of claim 8, wherein the test column address strobe signal includes a series of high to low and low to high transitions, and wherein the step of outputting comprises outputting the data read from the plurality of memory cells from the integrated circuit memory device in response to the series of high to low and low to high transitions of the test column address strobe signal.

10. The method of claim 8, wherein the step of generating comprises generating a plurality of control signals that read data from the plurality of memory cells in the memory array in the integrated circuit memory device in response to the test column address strobe signal.

11. The method of claim 8, wherein the step of generating comprises generating a first enable signal, a second enable signal and a third enable signal in response to a count of transitions of the test column address strobe signal.

12. The method of claim 8, wherein the step of outputting comprises:
    latching the data read from the plurality of memory cells in response to a control signal; and
    shifting the data latched by the data latch in response to the test column address strobe signal.

13. The method of claim 12, wherein the latched data includes a plurality of odd data bits and even data bits, and wherein the step of shifting comprises outputting the odd data bits from the integrated circuit memory device in response to high to low transitions of the test column address strobe signal, and outputting the even data bits from the integrated circuit memory device in response to low to high transitions of the test column address strobe signal.

14. An integrated circuit memory device that includes a test mode, wherein data is written to and read from the integrated circuit memory device in the test mode, the integrated circuit memory device comprising:
    means for storing data;
    means for generating a plurality of control signals that read test data from the means for storing data; and
    means for outputting the data read from the means for storing data to external of the integrated circuit memory device in response to a series of high to low and low to high transitions of a test column address strobe signal during at least one of a high and low state of a test row address strobe signal.

15. The integrated circuit memory device of claim 14, wherein the test column address strobe signal includes a series of high to low and low to high transitions, and wherein the means for outputting comprises means for outputting the data read from the means for storing data from the integrated circuit memory device in response to the series of high to low and low to high transitions.

16. The integrated circuit of claim 14, wherein the means for generating comprises means for generating a plurality of control signals that read data from the plurality of memory cells in the memory array in the integrated circuit memory device in response to the test column address strobe signal.

17. The integrated circuit memory device of claim 14, wherein the means for generating comprises means for generating a first enable signal, a second enable signal and a third enable signal in response to a count of transitions of the test column address strobe signal.

18. The integrated circuit memory device of claim 17, wherein the means for generating comprise:
means for generating a first control signal in response to a first count of transitions of the test column address strobe signal so as to latch a test address to the means for storing data;
means for generating a second control signal in response to a second count of transitions of the test column address strobe signal so as enable a column select line to the means for storing data; and
means for generating a third control signal that latches the data read from the means for storing data in the data output circuit.

19. The integrated circuit memory device of claim 14, wherein the means for outputting comprises:
means for latching the data read from the means for storing data in response to a control signal; and
means for shifting the data latched by the data latch in response to the test column address strobe signal.

20. The integrated circuit memory device of claim 19, wherein the latched data includes a plurality of odd data bits and even data bits, and wherein the means for shifting comprises:
means for outputting the odd data bits from the integrated circuit memory device in response to high to low transitions of the test column address strobe signal; and
means for outputting the even data bits from the integrated circuit memory device in response to low to high transitions of the test column address strobe signal.

21. The integrated circuit memory device of claim 14, wherein the data read from the plurality of memory cells includes odd data bits and even data bits, wherein the means for outputting comprises:
means for latching the odd data bits in the data read from the plurality of memory cells so as to produce latched odd data bits;
means for latching the even data bits in the data read from the means for storing data so as to produce latched even data bits;
means for storing the latched odd data bits in response to a control signal and shifting the stored latched odd data bits in response to high to low transitions of the test column address strobe signal;
means for storing the latched even data bits in response to the second control signal and shifting the stored latched even data bits in response to high to low transitions of the test column address strobe signal; and
means for outputting the odd data bits shifted from the first latch from the integrated circuit memory device in response to a first transition of the test column address strobe signal and that outputs the even data bits shifted from the second latch from the integrated circuit memory device in response to a second transition of the test column address strobe signal.

* * * * *